US011152544B2

(12) United States Patent
Kim et al.

(10) Patent No.: US 11,152,544 B2
(45) Date of Patent: Oct. 19, 2021

(54) METHODS FOR FABRICATING CSP LEDS (71) Applicant: LUMENS CO., LTD., Yongin-si (KR)

(72) Inventors: Daewon Kim, Yongin-si (KR); Yelim Won, Yongin-si (KR)

(73) Assignee: LUMENS CO., LTD., Yongin-si (KR)

(*) Notice: Subject to any disclaimer, the term of this patent is extended or adjusted under 35 U.S.C. 154(b) by 0 days.

(21) Appl. No.: 16/794,622

(22) Filed: Feb. 19, 2020

(65) Prior Publication Data
US 2020/0295234 A1 Sep. 17, 2020

(30) Foreign Application Priority Data

Mar. 11, 2019 (KR) .................. 10-2019-0027481

(51) Int. Cl.
*H01L 33/48* (2010.01)
*H01L 33/50* (2010.01)
(Continued)

(52) U.S. Cl.
CPC ........ *H01L 33/486* (2013.01); *H01L 25/0756* (2013.01); *H01L 25/50* (2013.01);
(Continued)

(58) Field of Classification Search
CPC ........... H01L 33/502; H01L 2933/0041; H01L 33/504; H01L 33/50; H01L 33/486;
(Continued)

(56) References Cited

U.S. PATENT DOCUMENTS

| 2014/0048825 A1* | 2/2014 | Hsieh | H01L 33/62 257/88 |
| 2017/0222107 A1* | 8/2017 | Chen | H01L 33/486 |
| 2018/0040786 A1* | 2/2018 | Chen | H01L 33/505 |

FOREIGN PATENT DOCUMENTS

| KR | 1020010038119 A | 5/2001 |
| KR | 1020130013468 A | 2/2013 |

(Continued)

*Primary Examiner* — Marcos D. Pizarro
*Assistant Examiner* — Antonio B Crite
(74) *Attorney, Agent, or Firm* — Mei & Mark LLP (57) ABSTRACT

Disclosed is a method for fabricating CSP LEDs. The method includes: preparing a plurality of flip-type LED chips, each of which includes a substrate and a semiconductor stack structure formed under the substrate and has a first conductive connection area and a second conductive connection area formed under the semiconductor stack structure; arraying the first conductive connection areas and the second conductive connection areas of the plurality of flip-type LED chips on a temporary support sheet; forming a wavelength converting member, which includes a side surface portion surrounding the side surfaces of the substrate and the semiconductor stack structure, an intermediate portion overlying the side surface portion to cover the upper surface of the substrate, and an upper surface portion overlying the intermediate portion, on the temporary support sheet; and removing the temporary support sheet and forming first electrode pads and second electrode pads in the first conductive connection areas and the second conductive connection areas of the flip-type LED chips, respectively. The first electrode pads and the second electrode pads protrude more downward than the lower surface of the wavelength converting member.

18 Claims, 5 Drawing Sheets (51) Int. Cl.
   *H01L 27/15*  (2006.01)
   *H01L 25/075* (2006.01)
   *H01L 25/00*  (2006.01)

(52) U.S. Cl.
   CPC .......... *H01L 27/153* (2013.01); *H01L 33/502* (2013.01); *H01L 2933/005* (2013.01); *H01L 2933/0041* (2013.01)

(58) Field of Classification Search
   CPC ............... H01L 2224/96; H01L 27/153; H01L 2224/04105; H01L 21/568
   See application file for complete search history.

(56) References Cited

FOREIGN PATENT DOCUMENTS

| | | |
|---|---|---|
| KR | 1020140134038 A | 11/2014 |
| KR | 1020150095430 A | 8/2015 |
| KR | 1020170039062 A | 7/2017 |
| KR | 1020170099650 A | 9/2017 |
| KR | 1020170133717 A | 12/2017 |

\* cited by examiner

METHODS FOR FABRICATING CSP LEDS

BACKGROUND OF THE INVENTION

1. Field of the Invention

The present invention relates to methods for fabricating CSP LEDs.

2. Description of the Related Art

Unlike lateral-type or vertical-type LED chips, flip LED chips include electrode pads on the lower surfaces thereof, eliminating the need for wire bonding. The advent of flip LED chips has accelerated the development of CSP LEDs.

Generally, a CSP LED includes a flip LED chip and a phosphor encapsulation as a light transmitting wavelength converting member covering the side surfaces and the upper surface of the flip LED chip. The CSP LED is not accommodated in a reflector or housing provided with a lead frame but can be directly mounted on a substrate such as a printed circuit board (PCB) because the encapsulation material is not provided on the lower surface of the flip LED chip and electrode pads disposed on the lower surface of the flip LED chip are exposed to the outside. Due to the absence of a reflector or housing, the CSP LED has the advantages of small size and light weight.

A conventional method for fabricating CSP LEDs includes preparing flip LED chips having electrode pads disposed on the lower surfaces thereof, arraying the flip LED chips on a sheet such that the electrode pads of the flip LED chips are in contact with the sheet, forming a phosphor-containing resin layer covering the side and upper surfaces of the flip LED chips arrayed on the sheet, and cutting the phosphor-containing resin layer along cutting lines between the adjacent flip LED chips to obtain a plurality of CSP LEDs. In each of the CSP LEDs, the wavelength converting member covers the upper surface and the side surfaces of the corresponding flip LED chip.

However, since the side surfaces of the electrode pads of the flip LED chips are covered with the phosphor encapsulation, the contact areas of the electrode pads with a bonding paste or solder are restricted to the narrow lower surfaces of the electrode pads. Further, there exists a risk that the electrode pads may be in contact with or contaminated by the phosphors, resulting in deterioration of electrical performance. Moreover, the upper surfaces of the CSP LEDs are exposed to the outside before formation of the phosphor-containing resin layer, increasing the risk of contamination by foreign materials during processing.

SUMMARY OF THE INVENTION

An object of the present invention is to provide methods for fabricating CSP LEDs in which the lower surfaces and the side surfaces of electrode pads are exposed to the outside such that the bonding areas of the electrode pads increase and the contact areas of the electrode pads with phosphors or a resin are reduced, achieving improved electrical reliability.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings.

First Embodiment

Figure 1:
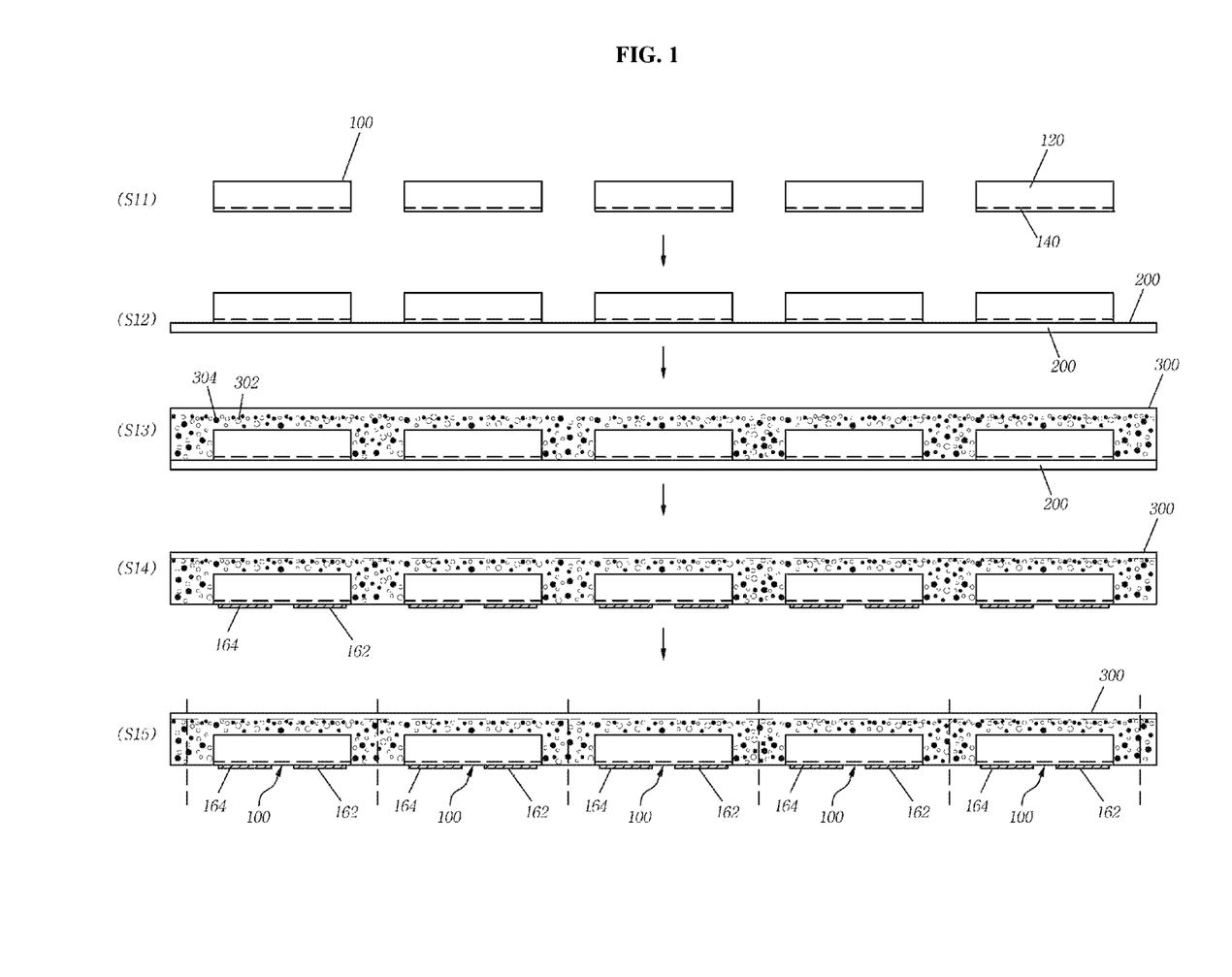
FIG. 1 illustrates a method for fabricating CSP LED according to a first embodiment of the present invention.

FIG. 1 illustrates a method for fabricating CSP LED according to a first embodiment of the present invention. Referring to FIG. 1, the method includes (S11) preparing a plurality of flip-type LED chips 100, each of which has a first conductive connection area and a second conductive connection area on the lower surface thereof, (S12) arraying the plurality of flip-type LED chips 100 on a temporary support sheet 200 such that the first conductive connection areas and the second conductive connection areas are covered with and hidden by the temporary support sheet 200, (S13) forming a wavelength converting member 300 on the temporary support sheet 200 to cover all upper surfaces and side surfaces of the plurality of flip-type LED chips 100, (S14) removing the temporary support sheet 200 and forming first electrode pads 162 and second electrode pads 164 in the first conductive connection areas and the second conductive connection areas of the flip-type LED chips 100, respectively, and (S15) cutting the wavelength converting member 300 along cutting lines indicated by the hidden lines between the adjacent flip-type LED chips 100. Steps S14 and S15 may be carried out in the reverse order.

Each of the plurality of flip-type LED chips 100 includes a sapphire substrate 120 and a gallium nitride-based semiconductor stack structure 140 formed under the sapphire substrate 120. The sapphire substrate 120 may be patterned. In this case, the pattern is formed on the surface of the sapphire substrate 120 where the semiconductor stack structure 140 grows. The pattern may have a semicircular, triangular, quadrangular or trapezoidal shape. The semiconductor stack structure 140 includes a first conductive semiconductor layer, an active layer, and a second conductive semiconductor layer.

In step S11, a plurality of flip-type LED chips 100 are prepared. First electrode pads and second electrode pads are not formed on the lower surfaces of the flip-type LED chips 100 and first conductive connection areas and second conductive connection areas are exposed on the lower surfaces of the flip-type LED chips 100. The first conductive connection areas and the second conductive connection areas formed on the lower surfaces of the flip-type LED chips 100 are electrically isolated from each other and are electrically connected to first conductive electrode pads and second conductive electrode pads, respectively, which are formed in the subsequent step. According to a conventional method for fabricating CSP LEDs, first electrode pads and second electrode pads are formed in first conductive connection areas and second conductive connection areas, respectively, before formation of a wavelength converting member. In contrast, according to the method of this embodiment, first electrode pads and second electrode pads are not formed in first conductive connection areas and second conductive connection areas, respectively, before formation of a wavelength converting member 300. In this embodiment, each of the lower surfaces of the flip-type LED chips 100 is divided into a first conductive connection area, a second conductive connection area, and an electrically insulating area, which lie in the same plane.

Step S12 includes arraying the plurality of flip-type LED chips 100 on a temporary support sheet 200 such that the first conductive connection areas and the second conductive connection areas are covered with and hidden by the temporary support sheet 200. The temporary support sheet 200 may have an adhesive strength to the flip-type LED chips 100. All lower surfaces of the flip-type LED chips 100 including the first conductive connection areas and the second conductive connection areas can be attached to the temporary support sheet 200 because first electrode pads and second electrode pads are not formed on the lower surfaces of the flip-type LED chips 100. The flip-type LED chips 100 are arrayed at uniform intervals along the lengthwise direction.

Figure 2:
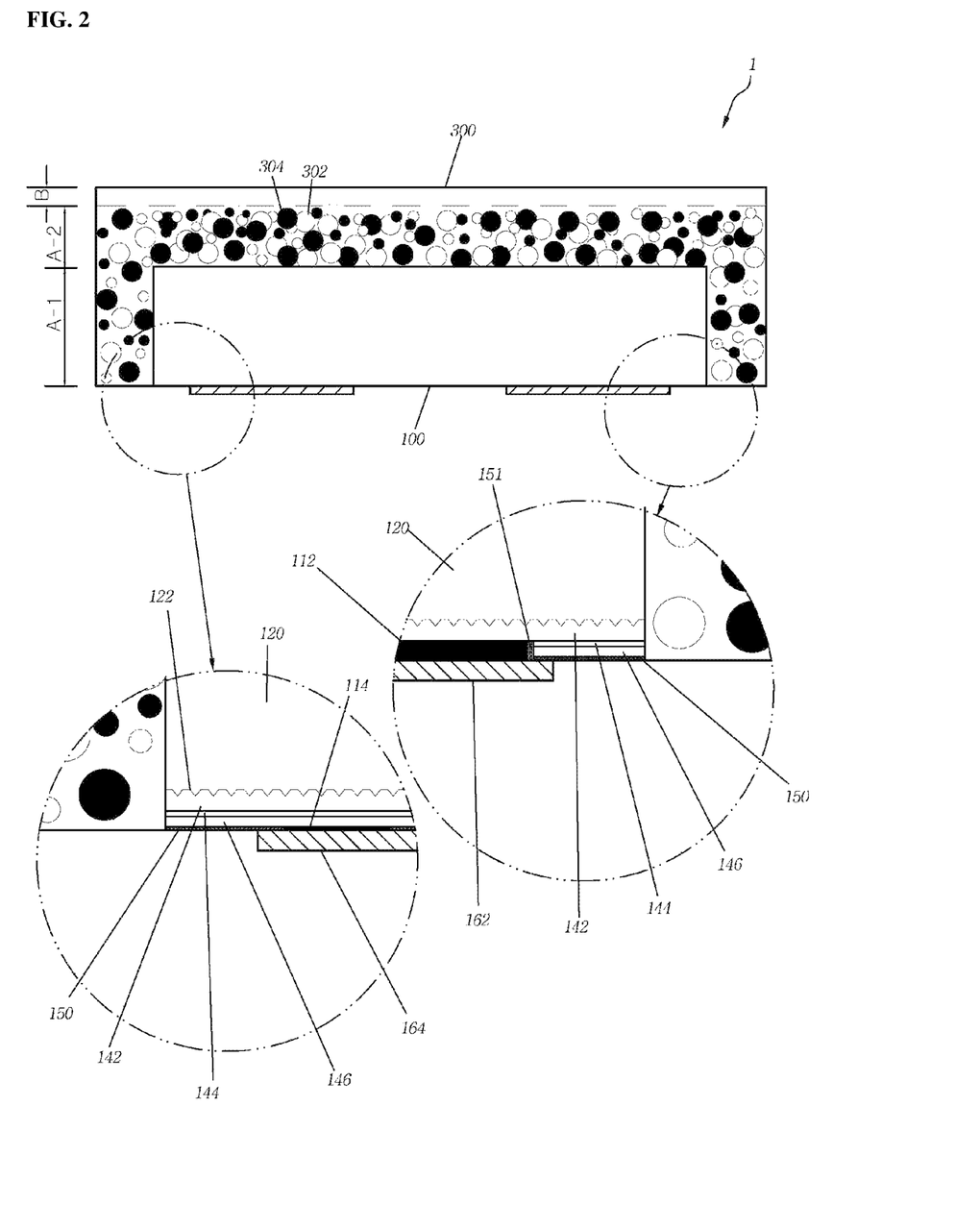
FIG. 2 is a cross-sectional view illustrating an exemplary CSP LED that can be fabricated by the method illustrated in FIG. 1.

FIG. 2 is a cross-sectional view illustrating an exemplary CSP LED that can be fabricated by the method illustrated in FIG. 1. Referring to FIG. 2, the first conductive connection area formed on the lower surface of the flip-type LED chip 100 can be connected to a first electrode pad 162 and includes a lower end surface of a first via conductor 112 that penetrates an electrically insulating layer 150, the second conductive semiconductor layer 146, and the active layer 144 and is connected to the first conductive semiconductor layer 142. The first conductor 112 is electrically isolated from the second conductive semiconductor layer 146 and the active layer 144 because its outer circumference is covered with an insulating cover layer 151. The lower end surface of the first conductor 112 constitutes the first conductive connection area and is electrically isolated from the second conductive connection area by the electrically insulating layer 150. The second conductive connection area includes a lower end surface of a second conductor 114 that penetrates the electrically insulating layer 150 and is connected to the second conductive semiconductor layer 146.

Referring again to FIG. 1, in step S13, a wavelength converting member 300 is formed on the temporary support sheet 200 to cover all upper surfaces and side surfaces of the plurality of flip-type LED chips 100. The wavelength converting member 300 may be formed by a mixture of one or more phosphors and an encapsulation material, for example, a resin powder. The flip-type LED chips 100 are preferably blue flip-type LED chips. It is preferable that the wavelength converting member 300 contains a red phosphor 302 excited by blue light to emit red light and a green phosphor 304 emitting green light or a yellow phosphor excited by blue light to emit yellow light.

The wavelength converting member 300 can be formed by various molding processes, particularly transfer molding. According to a transfer molding process, a resin powder is mixed with phosphors, the mixture is molded into tablets, the tablets are gelled or liquefied by softening under high temperature and high pressure conditions, and the gel or liquid is pressed into a cavity of a mold and molded into the wavelength converting member 300. Alternatively, a screen printing or squeezing process may be used to form the wavelength converting member 300. This molding process makes the upper surface of the wavelength converting member 300 flat.

The wavelength converting member 300 includes an underlying phosphor-containing zone A (see FIG. 2) and a phosphor-free zone B formed on the phosphor-containing zone A (see FIG. 2). The wavelength conversion of light occurs in the phosphor-containing zone A and the wavelength converted light is uniformly mixed without undergoing wavelength conversion in the phosphor-free zone B. The phosphor-containing zone A accounts for at least 90% of the total thickness of the wavelength converting member 300 and the phosphor-free zone has a very small thickness. The phosphor-containing zone (see FIG. 2) consists of a side surface portion A-1 (see FIG. 2) surrounding the side surfaces of the sapphire substrate 120 and the semiconductor stack structure 140 of the flip-type LED chip 100 and an intermediate portion A-2 (see FIG. 2) overlying the side surface portion A-1 (see FIG. 2) to cover the upper surface of the sapphire substrate 120 of the flip-type LED chip 100, which will be described below. The phosphor-free zone B (see FIG. 2) overlies the intermediate portion A-2 and forms an interface with the outside.

The overlying phosphor-free zone B is formed into a uniform layer. To this end, when the wavelength converting member 300 is formed by transfer molding, it is preferable that the phosphors are allowed to settle down in the direction towards the flip-type LED chip 100 in the resin due to its own weight and the volume of the phosphors exceeds 90% of the volume of the encapsulation material.

However, the wavelength converting member including the underlying phosphor-containing zone and the overlying phosphor-free zone cannot be formed by compression molding in which the phosphors are allowed to settle down in a direction away from the flip-type LED chip 100 in the resin in the form of a liquid or gel due to its own weight. The phosphor-containing zones A includes a height region in which the phosphors and the flip-type LED chip 100 are present and a height region in which only the phosphors are present.

The upper surface of the wavelength converting member 300 is flat and the lower surface of the wavelength converting member 300 lies in the same plane as the lower surface of the flip-type LED chip 100 which includes the first conductive connection area, the second conductive connection area, and the electrically insulating area.

In step S14, the temporary support sheet 200 is removed from the lower surfaces of the flip-type LED chips 100 and the lower surface of the wavelength converting member 300. As a result of removing the temporary support sheet 200, the first conductive connection areas and the second conductive connection areas formed on the lower surfaces of the flip-type LED chips 100 are exposed to the outside. In step S14, first electrode pads 162 and second electrode pads 164 are formed on the lower surfaces of the flip-type LED chips 100, particularly in the first conductive connection areas and the second conductive connection areas, respectively. The first electrode pads 162 and the second electrode pads 164 may be formed by a metal deposition process such as e-beam evaporation or sputtering. Suitable means is used to protect the wavelength converting member 300 and the flip-type LED chips 100 from the metal deposition conditions. After formation of the first electrode pads 162 and the second electrode pads 164 in step S14, the lower surface of the wavelength converting member 300 lies in substantially the same plane as the lower surfaces of the flip-type LED chips 100. The first electrode pads 162 and the second electrode pads 164 protrude more downward than the lower surface of the wavelength converting member 300 and the lower surfaces of the flip-type LED chips 100.

In step S15, the wavelength converting member 300 is cut along imaginary cutting lines indicated by the hidden lines between the adjacent flip-type LED chips 100 ("singulation") to provide a plurality of CSP LEDs 1 in which the wavelength converting member 300 covers the upper surfaces and the side surfaces of the flip-type LED chips 100.

As well illustrated in FIG. 2, the first electrode pad 162 and the second electrode pad 164 of the CSP LED 1 protrude more downward than the lower surface of the flip-type LED chip 100 lying at the same level as the lower surface of the wavelength converting member 300. With this arrangement, the lower surfaces as well as the side surfaces of the first electrode pad 162 and the second electrode pad 164 are not covered with the wavelength converting member 300, with the result that when the CSP LED 1 is mounted on a mount substrate such as a PCB, the contact areas of the first electrode pad 162 and the second electrode pad 164 with a bonding paste increase, ensuring stable and defect-free electrical connection and structural stability. In addition, the possibility of the contact of the first electrode pad 162 and the second electrode pad 164 with the phosphors or resin during processing is excluded to prevent the electrode pads from being contaminated by the phosphors or resin.

As mentioned earlier, the first conductive connection area is formed by the lower end surface of the first via conductor 112 that is connected to the first electrode pad 162 on the lower surface of the flip-type LED chip 100, penetrates the electrically insulating layer 150, the second conductive semiconductor layer 146, and the active layer 144, and is connected to the first conductive semiconductor layer 142. The outer circumference of the first conductor 112 is covered with the insulating cover layer 151. The first conductive connection area formed by the lower end surface of the first conductor 112 is electrically isolated from the second conductive connection area by the electrically insulating layer 150. The second conductive connection area is formed by the lower end surface of the second conductor 114 that penetrates the electrically insulating layer 150 and is connected to the second conductive semiconductor layer 146.

As mentioned earlier, the wavelength converting member 300 includes an underlying phosphor-containing zone A and a phosphor-free zone B formed on the phosphor-containing zone A. The wavelength conversion of light occurs in the phosphor-containing zone A and the wavelength converted light is uniformly mixed without undergoing wavelength conversion in the phosphor-free zone B. The phosphor-containing zone A accounts for at least 90% of the total thickness of the wavelength converting member 300 and the phosphor-free zone has a very small thickness. The phosphor-containing zone consists of a side surface portion A-1 surrounding the side surfaces of the sapphire substrate 120 and the semiconductor stack structure 140 of the flip-type LED chip 100 and an intermediate portion A-2 overlying the side surface portion A-1 to cover the upper surface of the sapphire substrate 120 of the flip-type LED chip 100. The phosphor-free zone B overlies the intermediate portion A-2 and forms an interface with the outside.

In this embodiment, the sapphire substrate 120 includes a pattern 122 formed at the interface with the semiconductor stack structure 140 to increase the light extraction efficiency of the flip-type LED chip.

Second Embodiment

Figure 3:
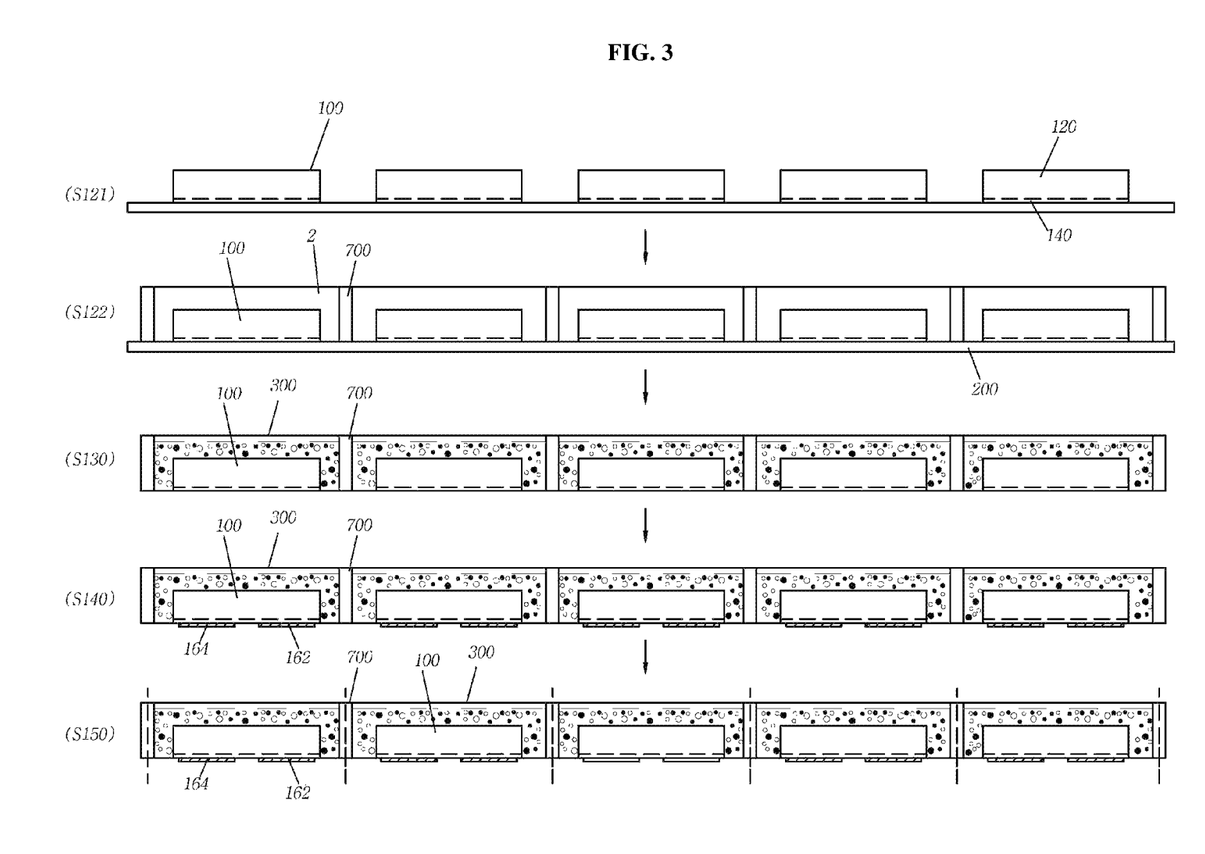
FIG. 3 illustrates a method for fabricating CSP LED according to a second embodiment of the present invention.

FIG. 3 illustrates a method for fabricating CSP LED according to a second embodiment of the present invention.

Referring to FIG. 3, the method includes preparing a plurality of flip-type LED chips 100, each of which has a first conductive connection area and a second conductive connection area on the lower surface thereof, (S121) arraying the plurality of flip-type LED chips 100 on a temporary support sheet 200 such that the first conductive connection areas and the second conductive connection areas are covered with and hidden by the temporary support sheet 200, (S122) forming barriers 700 on the temporary support sheet 200 to define spaces 2 around the chips, (S130) forming a wavelength converting member 300 on the temporary support sheet 200 to cover all upper surfaces and side surfaces of the plurality of flip-type LED chips 100 and fill the spaces around the chips defined by the barriers 700, (S140) removing the temporary support sheet 200 and forming first electrode pads 162 and second electrode pads 164 in the first conductive connection areas and the second conductive connection areas of the flip-type LED chips 100, respectively, and (S150) cutting the barriers 700 along cutting lines, each of which passes through the upper end and the lower end of the corresponding barrier 700, between the adjacent flip-type LED chips 100. Steps S121 and S122 may be carried out in the reverse order. Steps S140 and S150 may be carried out in the reverse order.

The structure of each of the plurality of flip-type LED chips 100 may be identical to that in the first embodiment and its detailed description is omitted. The step of preparing p the plurality of flip-type LED chips 100 is the same as step S11 of the first embodiment.

Step S121 may be the same as step S12 of the first embodiment.

In step S122, barriers 700 are formed on the temporary support sheet 200 to define spaces 2 around the chips. In this embodiment, the flip-type LED chips 100 are arrayed on a temporary support sheet 200 in step S121, and thereafter, barriers 700 are formed to surround the flip-type LED chips 100 in step S122. Alternatively, barriers 700 are formed on a temporary support sheet 200, on which flip-type LED chips 100 are not arrayed, to form chip-accommodating spaces, and thereafter, flip-type LED chips 100 are arrayed on the temporary support sheet 200 such that the chips 100 are accommodated in the individual chip-accommodating spaces. The barriers 700 are preferably reflective barriers made of a mixture of a reflective material and a resin material. The reflective material may be, for example, $TiO_2$ or $SiO_2$ in the form of particles.

In S130, a wavelength converting member 300 is formed on the temporary support sheet 200 to cover all upper surfaces and side surfaces of the plurality of flip-type LED chips 100. Here, the wavelength converting member 300 fills the spaces around the chips defined by the barriers 700. It is preferable that the upper surface of the wavelength converting member 300 lies in the same plane as the upper end surfaces of the barriers 700. The wavelength converting member 300 is made of the same material and is formed in the same manner as in the first embodiment, except that the wavelength converting member 300 fills the chip-accommodating spaces defined by the barriers 700. In step S140, the temporary support sheet 200 is removed from the lower surface of the wavelength converting member 300, the lower end surfaces of the barriers 700, and the lower surfaces of the flip-type LED chips 100. As a result of removing the temporary support sheet 200, the first conductive connection areas and the second conductive connection areas formed on the lower surfaces of the flip-type LED chips 100 are exposed to the outside. In step S140, first electrode pads 162 and second electrode pads 164 are formed on the lower surfaces of the flip-type LED chips 100, particularly in the first conductive connection areas and the second conductive connection areas, respectively. The structures of the first electrode pads 162 and the second electrode pads 164 may be identical to those in the first embodiment. The first electrode pads 162 and the second electrode pads 164 may be formed in the same manner as in the first embodiment.

In step S150, the barriers 700 are cut along cutting lines, each of which passes through the upper end and the lower end of the corresponding barrier 700, between the adjacent flip-type LED chips 100 to obtain a plurality of CSP LEDs 1. As a result of this cutting, each of the barriers 700 is divided into two smaller ones whose thickness is reduced to one-half the original thickness.

Figure 4:
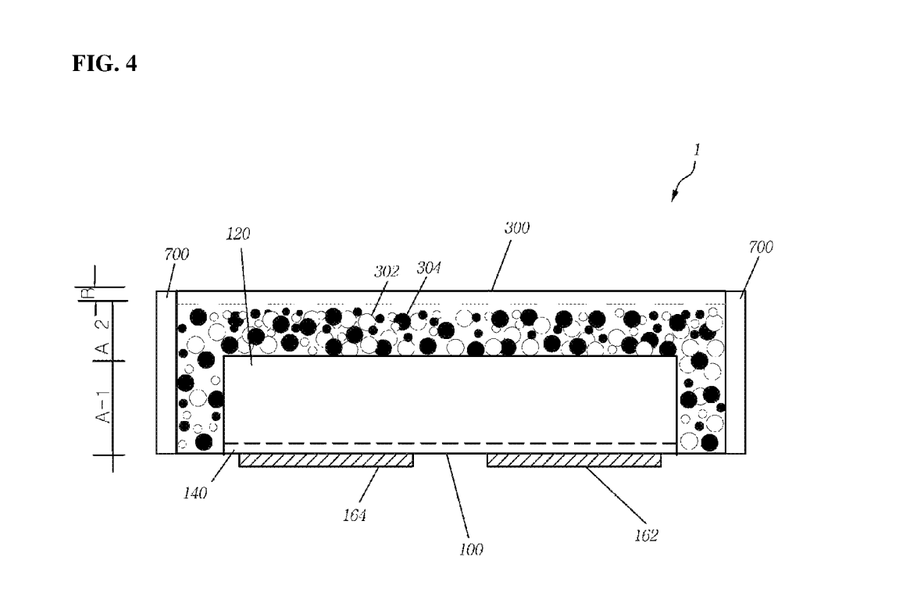
FIG. 4 is a cross-sectional view illustrating an exemplary CSP LED that can be fabricated by the method illustrated in FIG. 3.

In each of the CSP LEDs 1, the upper surface and the side surfaces of the flip-type LED chip 100 are covered with the wavelength converting member 300, the barriers 700 surround the outer circumference of the wavelength converting member 300, and the first electrode pad 162 and the second electrode pad 164 are formed on the lower surfaces of the flip-type LED chip 100 and protrude more downward than the lower surface of the wavelength converting member 300 and the lower end surfaces of the barriers 700, as well illustrated in FIG. 4. The structure of the flip-type LED chip 100 may be identical to that in the first embodiment.

Third Embodiment

Figure 5:
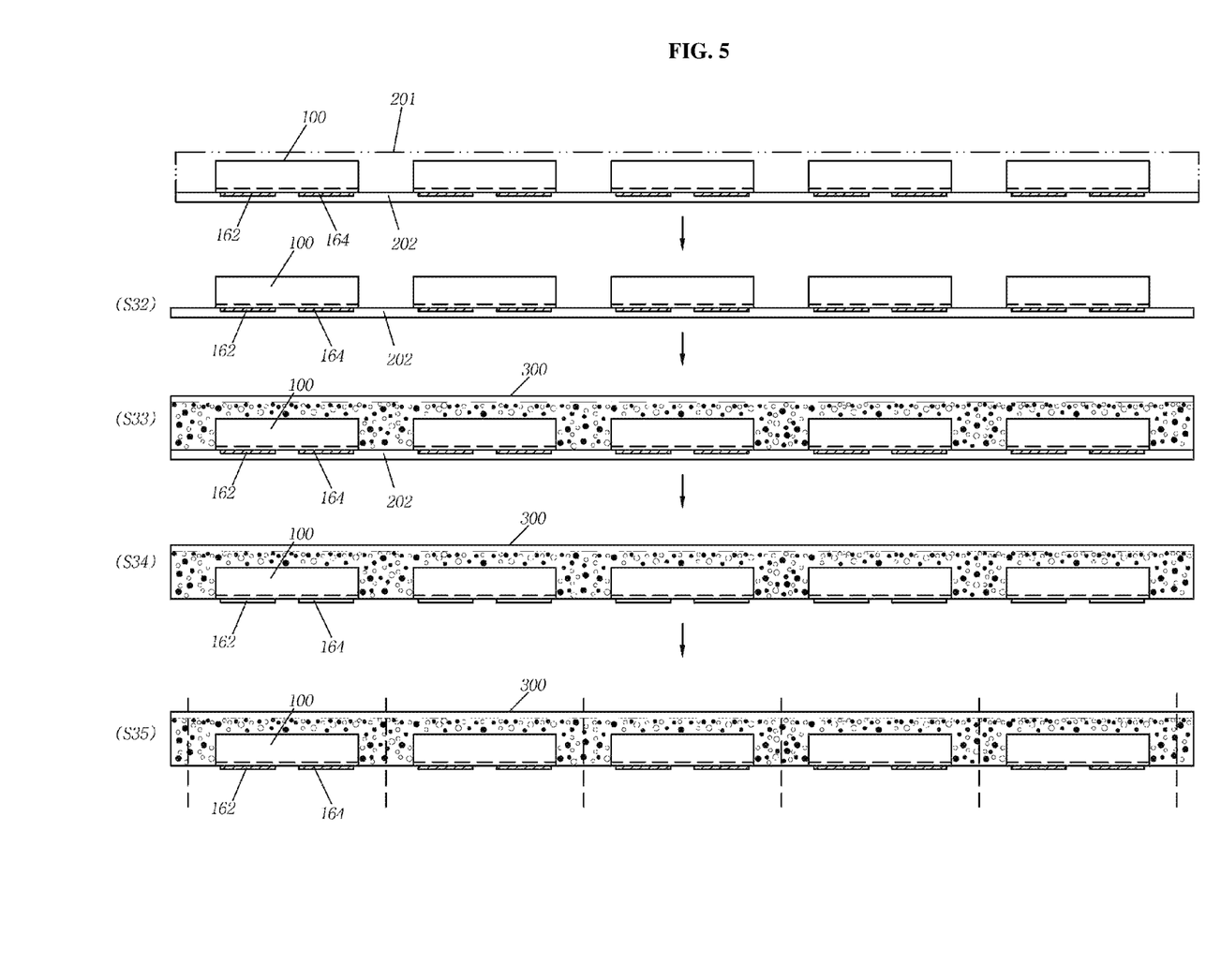
FIG. 5 illustrates a method for fabricating CSP LED according to a third embodiment of the present invention.

FIG. 5 illustrates a method for fabricating CSP LED according to a third embodiment of the present invention. Referring to FIG. 5, the method includes preparing a plurality of flip-type LED chips 100, each of which includes a first conductive connection area and a second conductive connection area formed on the lower surface thereof and a first electrode pad 162 and a second electrode pad 164 formed in the first conductive connection area and the second conductive connection area, respectively, and (S32) forming a temporary support layer 202 covering all exposed surfaces (side surfaces and lower surfaces) of the first electrode pads 162 and the second electrode pads 164 while supporting the plurality of flip-type LED chips 100 in a predetermined array. Prior to formation of the temporary support layer 202, a sacrificial support layer 201 is formed to cover all surfaces of the flip-type LED chips 100 except for the first conductive connection areas hidden by the first electrode pads 162 and the second conductive connection areas hidden by the second electrode pads 164. The temporary support layer 202 is formed on the sacrificial support layer 201 to cover all exposed surfaces of the first electrode pads 162 and the second electrode pads 164 while supporting the flip-type LED chips 100. The temporary support layer 202 includes an upper surface lying in the same plane as the lower surfaces of the flip-type LED chips 100 and recesses depressed to a predetermined depth from the upper surface to embed the first electrode pads 162 and the second electrode pads 164 therein. After formation of the temporary support layer 202, the sacrificial support layer 201 is removed by a suitable process, for example, etching.

The method includes (S33) forming a wavelength converting member 300 on the temporary support layer 202 to cover all upper surfaces and the side surfaces of the plurality of flip-type LED chips 100 and (S34) removing the temporary support layer 202. The temporary support layer 202 can be removed by various suitable processes, for example, etching.

As a result of removing the temporary support layer 202, the lower surfaces of the flip-type LED chips 100, the lower surface of the wavelength converting member 300, the side surfaces of the first electrode pads 162, and the side surfaces of the second electrode pads 164 are exposed to the outside. The first electrode pads 162 and the second electrode pads 164 protrude more downward than the lower surfaces of the flip-type LED chips 100 and the lower surface of the wavelength converting member 300.

The method includes (S35) cutting the wavelength converting member 300 along cutting lines between the adjacent flip-type LED chips 100. Steps S34 and S35 may be carried out in the reverse order.

What is claimed is:

1. A method for fabricating CSP LEDs, comprising:
preparing a plurality of flip-type LED chips, each of which comprises a substrate and a semiconductor stack structure formed under the substrate and has a first conductive connection area and a second conductive connection area formed under the semiconductor stack structure;
arraying the first conductive connection areas and the second conductive connection areas of the plurality of flip-type LED chips on a temporary support sheet;
forming a wavelength converting member, which comprises a side surface portion surrounding the side surfaces of the substrate and the semiconductor stack structure, an intermediate portion overlying the side surface portion to cover the upper surface of the substrate, and an upper surface portion overlying the intermediate portion, on the temporary support sheet; and
removing the temporary support sheet and forming first electrode pads and second electrode pads in the first conductive connection areas and the second conductive connection areas of the flip-type LED chips, respectively,
wherein the first electrode pads and the second electrode pads protrude more downward than the lower surface of the wavelength converting member, and
wherein the first conductive connection area is defined by a lower end surface of a first conductor that penetrates an electrically insulating layer, a second conductive semiconductor layer, and an active layer of each of the plurality of flip-type LED chips and is connected to a first conductive semiconductor layer of the flip-type LED chip; and the second conductive connection area is defined by a lower end surface of a second conductor that penetrates the electrically insulating layer and is connected to the second conductive semiconductor layer.

2. The method according to claim 1, further comprising cutting the wavelength converting member after formation of the first electrode pads and the second electrode pads.

3. The method according to claim 1, wherein each of the plurality of flip-type LED chips further comprises an electrically insulating area lying in the same plane as the first conductive connection area and the second conductive connection area to electrically isolate the first conductive connection area and the second conductive connection area from each other.

4. The method according to claim 1, wherein the wavelength converting member is formed by molding a mixture of one or more phosphors and an encapsulation material on the temporary support sheet.

5. The method according to claim 1, wherein the side surface portion and the intermediate portion of the wavelength converting member are formed using a mixture of phosphors and an encapsulation material; and the upper surface portion of the wavelength converting member is formed using only the encapsulation material and has a thickness corresponding to less than 10% of the total thickness of the wavelength converting member.

6. The method according to claim 1, wherein the lower surface of the wavelength converting member lies in the same plane as the lower surfaces of the flip-type LED chips.

7. The method according to claim 1, further comprising cutting the wavelength converting member along cutting lines between the adjacent flip-type LED chips.

8. The method according to claim 1, further comprising forming barriers defining spaces around the chips on the temporary support sheet before or after arraying the flip-type LED chips wherein the wavelength converting member is formed to cover all upper surfaces and side surfaces of the plurality of flip-type LED chips and fill the spaces around the chips defined by the barriers.

9. The method according to claim 8, further comprising cutting the barriers along cutting lines, each of which passes through the upper end and the lower end of the corresponding barrier, between the adjacent flip-type LED chips.

10. A method for fabricating CSP LEDs, comprising:
preparing a plurality of flip-type LED chips, each of which comprises a substrate and a semiconductor stack structure formed under the substrate and has a first conductive connection area and a second conductive connection area formed under the semiconductor stack structure and a first electrode pad and a second electrode pad formed in the first conductive connection area and the second conductive connection area, respectively;
forming a temporary support layer covering all exposed surfaces of the first electrode pads and the second electrode pads while supporting the flip-type LED chips in a predetermined array;
forming a wavelength converting member, which comprises a side surface portion surrounding the side surfaces of the substrate and the semiconductor stack structure, an intermediate portion overlying the side surface portion to cover the upper surface of the substrate, and an upper surface portion overlying the intermediate portion, on the temporary support layer; and
removing the temporary support layer from the lower surface of the wavelength converting member and the lower surfaces of the flip-type LED chips,
wherein the first electrode pads and the second electrode pads protrude more downward than the lower surface of the wavelength converting member.

11. The method according to claim 10, further comprising cutting the wavelength converting member along cutting lines between the adjacent flip-type LED chips.

12. The method according to claim 10, wherein a sacrificial support layer is formed to cover all surfaces of the flip-type LED chips except for the first conductive connection areas hidden by the first electrode pads and the second conductive connection areas hidden by the second electrode pads before formation of the temporary support layer; the temporary support layer is formed on the sacrificial support layer to cover all exposed surfaces of the first electrode pads and the second electrode pads; and the sacrificial support layer is removed before formation of the wavelength converting member on the temporary support layer.

13. The method according to claim 10, wherein each of the plurality of flip-type LED chips further comprises an electrically insulating area lying in the same plane as the first conductive connection area and the second conductive connection area to electrically isolate the first conductive connection area and the second conductive connection area from each other.

14. The method according to claim 10, wherein the first conductive connection area is defined by a lower end surface of a first conductor that penetrates an electrically insulating layer, a second conductive semiconductor layer, and an active layer of each of the plurality of flip-type LED chips and is connected to a first conductive semiconductor layer of the flip-type LED chip; and the second conductive connection area is defined by a lower end surface of a second conductor that penetrates the electrically insulating layer and is connected to the second conductive semiconductor layer.

15. The method according to claim 10, wherein the side surface portion and the intermediate portion of the wavelength converting member are formed using a mixture of phosphors and an encapsulation material; and the upper surface portion of the wavelength converting member is formed using only the encapsulation material and has a thickness corresponding to less than 10% of the total thickness of the wavelength converting member.

16. A CSP LED comprising:
a flip-type LED chip comprising a substrate and a semiconductor stack structure formed under the substrate and having a first conductive connection area and a second conductive connection area formed under the semiconductor stack structure;
a wavelength converting member comprising a side surface portion surrounding the side surfaces of the substrate and the semiconductor stack structure, an intermediate portion overlying the side surface portion to cover the upper surface of the substrate, and an upper surface portion overlying the intermediate portion; and
a first electrode pad and a second electrode pad formed in the first conductive connection area and the second conductive connection area, respectively, and protruding more downward than the lower surface of the flip-type LED chip and the lower surface of the wavelength converting member,
wherein the side surface portion and the intermediate portion of the wavelength converting member are formed using a mixture of phosphors and an encapsulation material, and the upper surface portion of the wavelength converting member is formed using only the encapsulation material and has a thickness corresponding to less than 10% of the total thickness of the wavelength converting member,
wherein the first conductive connection area is defined by a lower end surface of a first conductor that penetrates an electrically insulating layer, a second conductive semiconductor layer, and an active layer of the flip-type LED chip and is connected to a first conductive semiconductor layer of the flip-type LED chip, and
wherein the second conductive connection area is defined by a lower end surface of a second conductor that penetrates the electrically insulating layer and is connected to the second conductive semiconductor layer.

17. The CSP LED according to claim 16, further comprising an electrically insulating area lying in the same plane as the first conductive connection area and the second conductive connection area to electrically isolate the first conductive connection area and the second conductive connection area from each other.

18. The CSP LED according to claim 16, further comprising barriers surrounding the outer side surfaces of the wavelength converting member wherein the first electrode pad and the second electrode pad protrude more downward than the lower end surfaces of the barriers.

\* \* \* \* \*